(12) United States Patent
Shimada et al.

(10) Patent No.: US 6,693,840 B2
(45) Date of Patent: Feb. 17, 2004

(54) NON-VOLATILE SEMICONDUCTOR MEMORY DEVICE WITH ENHANCED ERASE/WRITE CYCLE ENDURANCE

(75) Inventors: Yasuhiro Shimada, Muko (JP); Yoshihisa Kato, Otsu (JP); Takayoshi Yamada, Takatsuki (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 10/271,139

(22) Filed: Oct. 15, 2002

(65) Prior Publication Data
US 2003/0095463 A1 May 22, 2003

(30) Foreign Application Priority Data
Oct. 17, 2001 (JP) ...................... P2001-319525

(51) Int. Cl.[7] ................................. G11C 7/00
(52) U.S. Cl. ..................................... 365/228
(58) Field of Search ................. 365/226, 227, 365/228, 149, 229

(56) References Cited

U.S. PATENT DOCUMENTS

| 5,485,623 A | | 1/1996 | Kurokawa et al. ............ 714/22 |
| 5,799,200 A | * | 8/1998 | Brant et al. .................. 713/340 |
| 6,181,830 B1 | * | 1/2001 | Sato ........................... 382/274 |

FOREIGN PATENT DOCUMENTS

| JP | 6-259172 | 9/1994 |
| JP | 11167794 A | 6/1999 |

* cited by examiner

*Primary Examiner*—Vu A. Le

(57) ABSTRACT

The power-supply unit, while directing externally supplied power to the control unit and the like, accumulates an amount of power that is required by the control unit to save data from the volatile memory to the non-volatile memory. When an external power supply has started, the control unit restores data of the non-volatile memory in the volatile memory; and when the external power supply has stopped, the control unit saves data from the volatile memory to the non-volatile memory.

7 Claims, 7 Drawing Sheets

NON-VOLATILE SEMICONDUCTOR MEMORY DEVICE WITH ENHANCED ERASE/WRITE CYCLE ENDURANCE

CROSS-REFERENCE TO RELATED APPLICATIONS

This application is based on Patent Application Ser. No. 2001-319525, filed in Japan, the contents of which are hereby incorporated by reference.

BACKGROUND OF THE INVENTION (1) Field of the Invention

The present invention relates to a non-volatile semiconductor memory device, and in particular to a technology for rewriting content that has been recorded in such semiconductor memory device.

(2) Description of Related Art

In recent years, with the development of the information communication technology, various types of computers including personal computers have been widespread. Such computers normally use DRAM (dynamic random access memory), SRAM (static RAM), as their main memory device. Since DRAM and SRAM are volatile memories, they need to receive power all the time, in order to retain the data having been stored therein. If a power supply is stopped due to an accident and others, the stored data will be lost.

To cope with the stated problem, an information processing apparatus has been proposed, for example, as disclosed by a Japanese Laid-open Patent Application No. H06-259172. The information processing apparatus disclosed by this prior art has a structure shown in FIG. 1. In the information processing apparatus, when the battery control apparatus detects a reduction in battery voltage, the CPU (central processing unit) instructs to save the data from RAM into the external memory device, while the information processing apparatus is receiving power from the sub-battery.

By the above stated structure, upon detection of a voltage reduction in the main power source, the main power source is replaced with a backup power source, and at the same time the data initially stored in the volatile memory will be saved into a non-volatile memory. This will prevent the loss of the stored data, which would result from a malfunction of the main power source.

However, in the information processing apparatus, data will be first read from the volatile memory according to the CPU instruction, and then saved in the non-volatile memory. Therefore, until the completion of such data saving, power should be kept supplied to all the circuit-constituting devices including the CPU that are included in the information processing apparatus. This is problematic because it requires a large backup power source.

Nevertheless, a non-volatile memory has a limitation on the number of erase/write cycles (i.e. about $10^{10}$ cycles for ferroelectric RAM, and about $10^5$ cycles for flash memory), therefore cannot be adopted as a main memory device.

SUMMARY OF THE INVENTION

The object of the present invention, in view of the stated problems, is to provide a semiconductor memory device that retains data without requiring a large-scale backup power source if there is a power loss, and that has enhanced erase/write cycle endurance.

In order to achieve this object, the semiconductor memory device according to the present invention is characterized by being included in one chip, and having: a volatile memory; a non-volatile memory; a volatile memory access unit operable to allow a device external to the chip to access the volatile memory; a data save unit operable to save data from the volatile memory to the non-volatile memory; and a power-supply unit operable to accumulate power therein, and supply the accumulated power to the data save unit for use in saving data, where the volatile memory, the non-volatile memory, the volatile memory access unit, the data save unit, and the power-supply unit are integrated into the chip.

In the above construction, the volatile memory will be accessed when there is a request external to the chip for writing data. Accordingly, there will be no increase in number of erase/write cycles performed for the non-volatile memory, at a time when a device external to the chip has written data.

In addition, a sufficient amount of power to be supplied by the power-supply unit, when it is functioning as a backup power source, is an amount required by the semiconductor memory device for saving data. Therefore, unlike the conventional technology, the present invention does not require operation of the whole circuit including the semiconductor memory for saving data, and so a large backup power source is not necessary.

Here, the semiconductor memory device may further include a condition-change detect unit operable to detect a change of a condition of a power supply to the chip from a source external to the chip, where the data save unit saves the data from the volatile memory to the non-volatile memory when the condition-change detect unit detects a change from power-on to power-off.

Here, the semiconductor memory device may further include a data restore unit operable to restore data having been stored in the non-volatile memory into the volatile memory when the condition-change detect unit detects a change from power-off to power-on. This construction enables users to use the semiconductor memory device of the present invention as a volatile memory.

Here, the semiconductor memory device may further include an area-designation receive unit operable to receive a designation of a memory area in the non-volatile memory, where the data save unit saves the data to the designated memory area.

Here, the semiconductor memory device may further include a non-volatile memory access unit operable to allow a device external to the chip to read data from the non-volatile memory. With this construction, the capacity of the semiconductor memory device as a non-volatile memory device is enlarged, without increasing the volatile memory in capacity. Accordingly, it becomes possible to reduce the cost of the semiconductor memory device, and further to reduce the size thereof.

Here, the non-volatile memory may be one of a flash memory and a ferroelectric RAM. With this construction, the amount of power required in saving data from the volatile memory to the non-volatile memory will be reduced. Accordingly, the power to be accumulated within the semiconductor memory device will be reduced. This will lead to a reduction in size of the semiconductor memory device.

Here, the power-supply unit may be one of a chargeable secondary battery, a capacitor, and a reactance element, and accumulates power supplied to the chip from a source external to the chip. Use of such devices enables accumulation of necessary power while the power is supplied to the chip from a source external to the chip, and enables use of the accumulated power when a source external to the chip has stopped supplying power to the chip.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

The following describes embodiments of the present invention with reference to the drawings.

The First Embodiment

Figure 1:
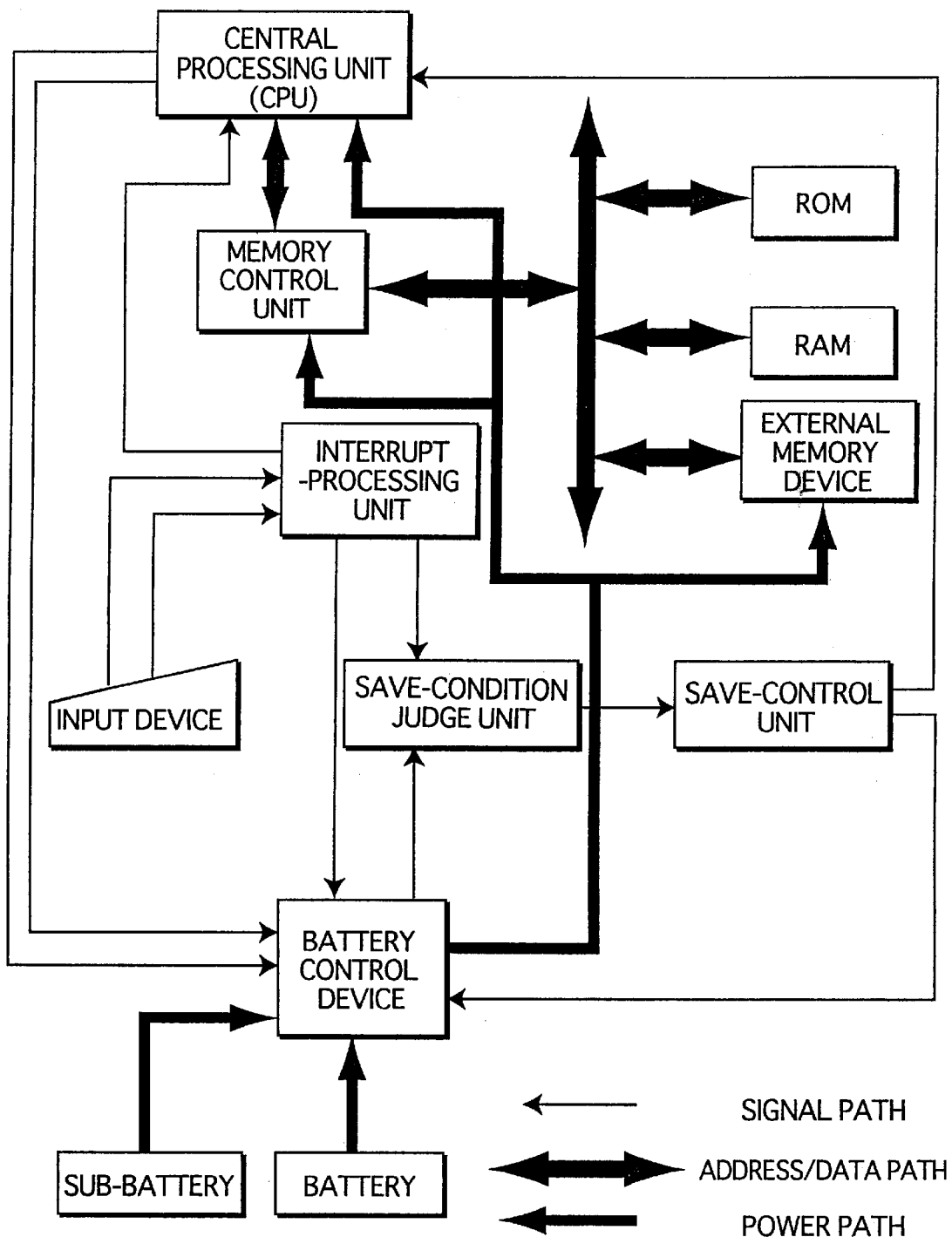
FIG. 1 is a functional block diagram showing the structure of the information processing apparatus that is disclosed by the Japanese Laid-open Patent Application H06-259172.
Figure 2:
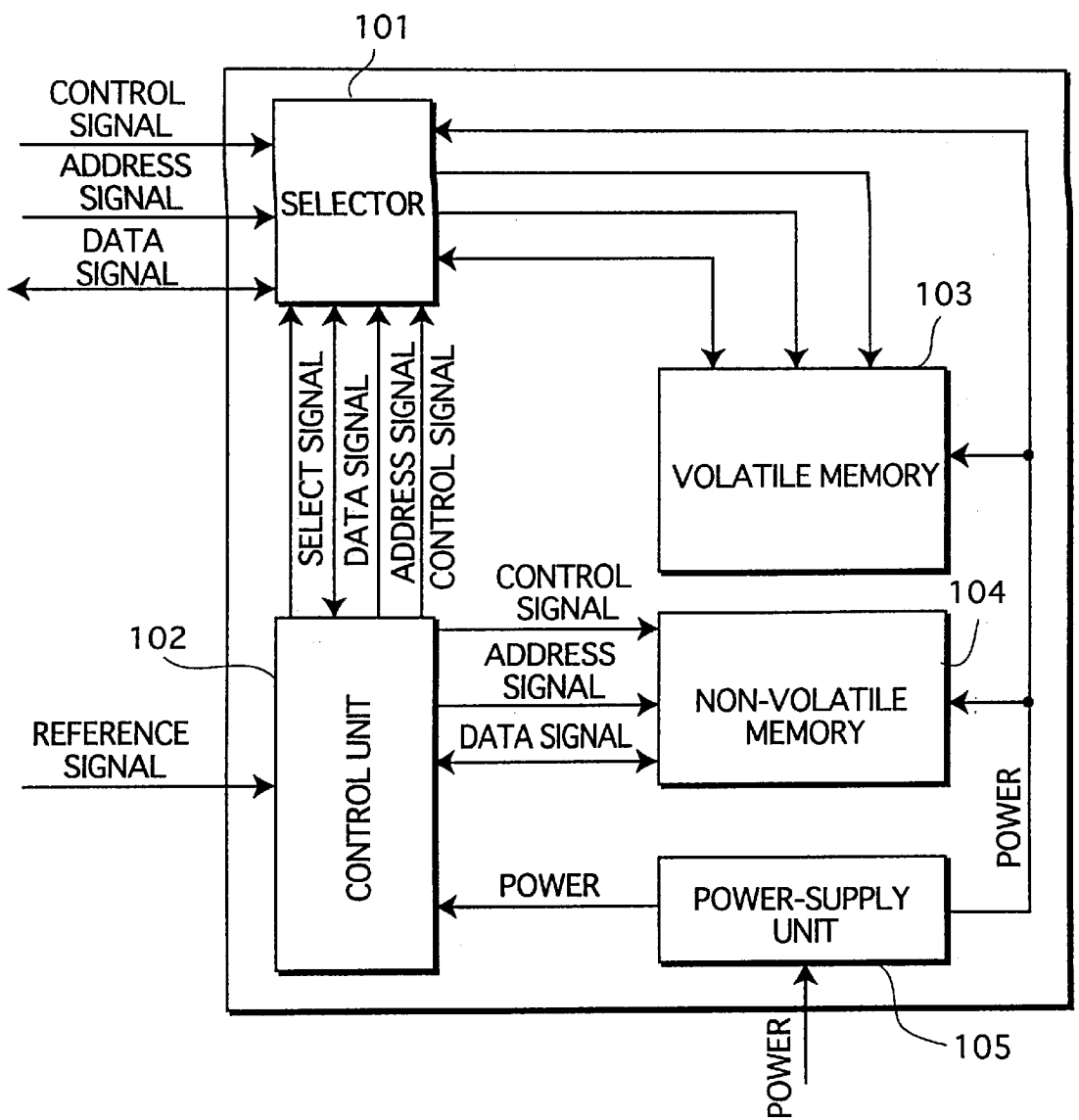
FIG. 2 is a functional block diagram showing the structure of a semiconductor memory device that relates to the first embodiment.

FIG. 2 is a functional block diagram showing the structure of a semiconductor memory device that relates to the first embodiment. In FIG. 2, the semiconductor memory device 1 includes a control unit 102, a volatile memory 103, a non-volatile memory 104, a selector 101, and a power-supply unit 105. The power-supply unit 105 supplies power to the control unit 102, when the power-supply unit 105 has received power from outside of the semiconductor memory device.

Figure 3:
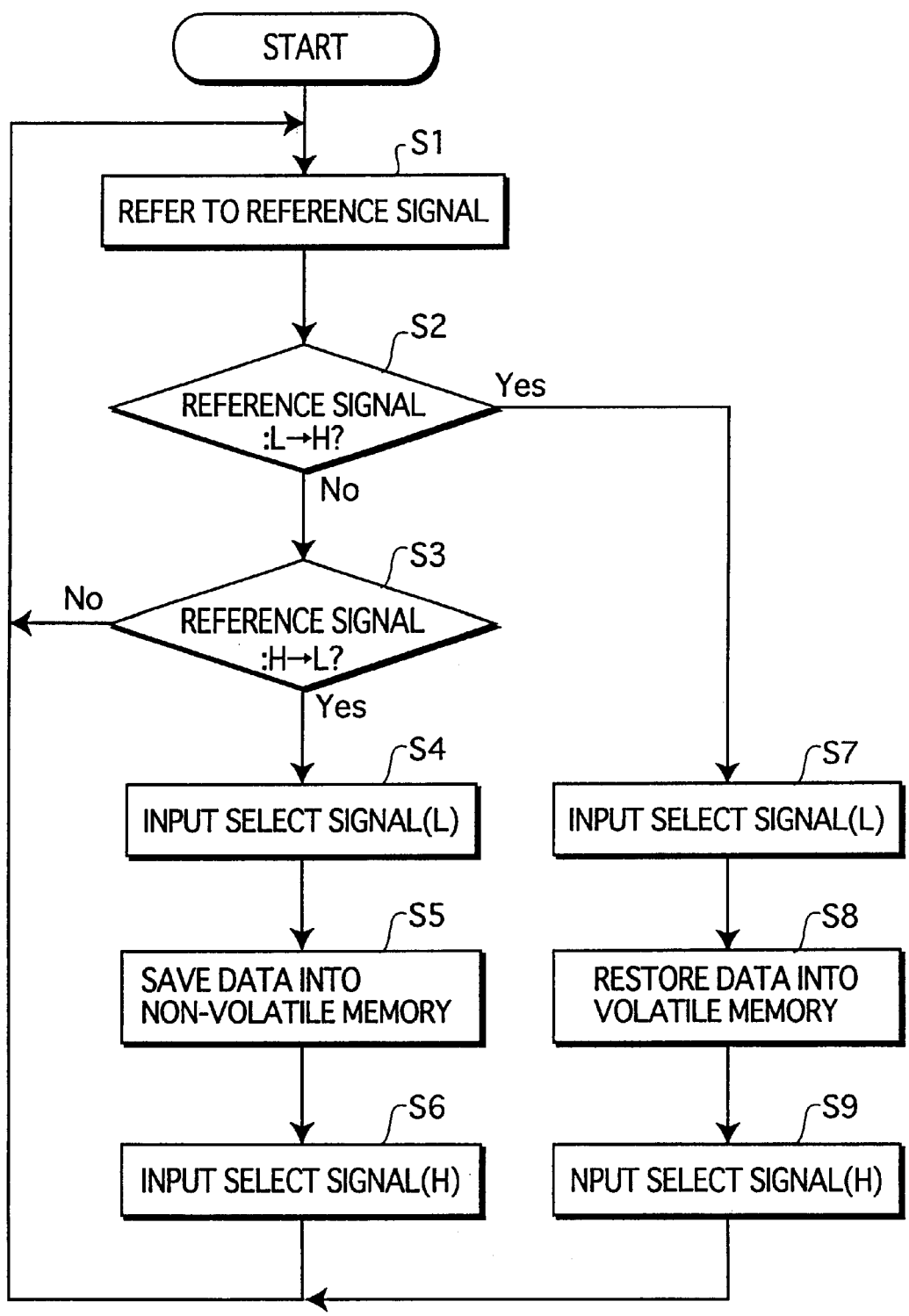
FIG. 3 is a flow chart showing operations that the control unit executes, for performing data copy between the volatile memory 103 and the non-volatile memory 104.

The control unit 102 controls operations of the semiconductor memory device 1. The control unit 102 receives a reference signal from outside of the semiconductor memory device 1, and performs data copying between the volatile memory 103 and the non-volatile memory 104 (i.e. save or restore), according to the reference signal. FIG. 3 is a flow chart showing operations that the control unit executes, for performing data copy between the volatile memory 103 and the non-volatile memory 104.

In FIG. 3, the control unit 102 first refers to a reference signal (S1). When the reference signal has changed from L to H (S2: Yes), the control unit 102, judging that the power supply has begun, shuts out any access to the volatile memory 103 from outside, so that the control unit 102 may access the volatile memory 103. More specifically, the control unit 102 inputs a select signal (L) to the selector 101 (S7).

After this, the control unit 102 reads data from the non-volatile memory 104, and copies the read data to the volatile memory 103 (i.e. restoring of data) (S8). After completion of restoring the data in the volatile memory 103, the control unit 102 inputs a select signal (H), so as to permit access from outside to the volatile memory 103 (S9).

On the contrary to the above, when the reference signal has changed from H to L (S3: Yes), the control unit 102, judging that the power supply has stopped, inputs a select signal (L) to the selector 101 (S4). After this, the control unit 102 copies data having been stored in the volatile memory 103 to the non-volatile memory 104 (saving of data) (S5), and inputs a select signal (H) to the selector 101 (S9). If the judgment in step S3 is in the negative (S3: No), or after steps S6 and S9, the control will be passed to S1 again, and the reference signal will be referred to.

The selector 101 receives a select signal having been sent from the control unit 102 as in the above, and switches between two modes in which access to the volatile memory is allowed differently. That is, when receiving a select signal (H), the selector 101 allows access from outside the semiconductor memory device 1 to the volatile memory 103; and when receiving a select signal (L), the selector 101 allows the control unit 102 to access the volatile memory 103.

The selector 101 receives, from a party that has been allowed an access, a control signal, an address signal, and a data signal, and transmits the received signals to the volatile memory 103. When receiving a data signal from the volatile memory 103, the selector 101 transfers the data signal to the party that is allowed an access.

Here, the volatile memory 103 and the non-volatile memory 104 have a same capacity. In copying data, the control unit 102 refers to a source memory from the beginning in sequence, and writing of data in a destination memory is also performed from the beginning in sequence. In order to access these memories, the control unit 102 outputs a control signal and an address signal, so as to perform read/write of data.

When receiving power from outside the semiconductor memory device 1, the power-supply unit 105 supplies power to the control unit 102 and the like, and at the same time, accumulates power inside the power-supply unit 105. The power-supply unit 105 accumulates power in itself up to an amount that is sufficient for saving data from the volatile memory 103 to the non-volatile memory 104, as a preparation to the stop of power supply. When detecting the stop of power supply from outside, the power-supply unit 105 supplies the accumulated power to the control unit 102, and the like.

Note here, that the accumulation of power is realized by integrating a power accumulating means that is both chargeable/dischargeable and has a small power capacity, in the semiconductor memory device 1. Examples for the power accumulating means are a ferroelectric capacitor, a reactance device, and a thin-film battery. According to the above, the semiconductor memory device 1 is able to save data from the volatile memory 103 into the non-volatile memory 104, without receiving any external power supply.

As a reference signal, other signals may be used such as so-called CE (chip enable), and CS (chip select). By using such signals, the effect of the present invention is achieved without increasing the number of pins at the semiconductor memory device 1. Therefore, the semiconductor memory device 1 according to the present invention is mountable on a circuit board, in the same manner as existing semiconductor memory devices.

In the above description, the volatile memory 103 may be SRAM and DRAM; the non-volatile memory 104 is desirably a ferroelectric RAM, for example. With use of ferroelectric RAM, the amount of power required for copying data between the volatile memory 103 and the non-volatile memory 104 will be reduced. Accordingly, it becomes possible to reduce the size of the power-supply unit 105. The non-volatile memory 104 may also be a flash memory.

As in the above, the volatile memory 103, the non-volatile memory 104, the control unit 102, the power-supply unit 105, and the like are integrated into one chip. As a result, an amount of power required for saving data when the power supply stops is reduced to the amount that is enough for the semiconductor memory device 1 to copy the data. Therefore, it becomes unnecessary to have a large-scale backup power source in saving data.

In addition, in the semiconductor memory device 1, the number of rewriting performed for the non-volatile memory 104 is reduced. This is because the semiconductor memory device 1 only performs rewriting for the volatile memory 103 as long as it receives power from outside. As a result, the non-volatile memory 104 according to the present invention has much enhanced erase/write cycle endurance, compared to a conventional non-volatile memory. Practically speaking, the non-volatile memory 104 allows unlimited erase/write cycles, in number.

Furthermore, the semiconductor memory device 1 achieves the same access speed as that of the conventional volatile memory, since only the volatile memory portion will be allowed access from outside the semiconductor memory device 1. Therefore, the present invention provides a semiconductor memory device that does not require a large-scale backup power source, allows practically an unlimited number of rewriting, and achieves the same access speed as the conventional volatile memory.

The Second Embodiment

Figure 4:
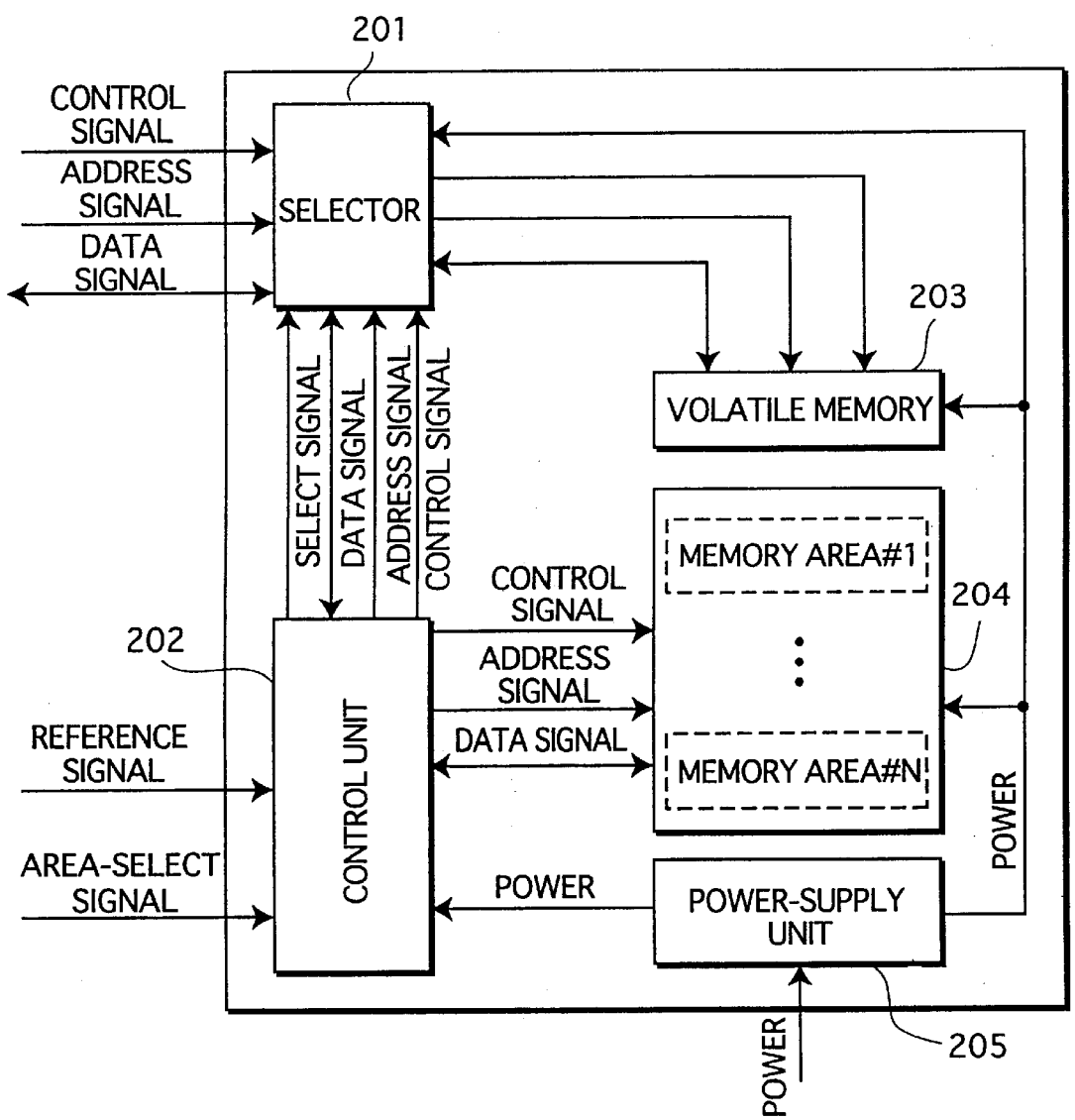
FIG. 4 is a functional block diagram showing the structure of the semiconductor memory device according to the second embodiment.

Next, a semiconductor memory device according to the second embodiment is described as follows. The structure of the semiconductor memory device according to the present embodiment is almost the same as that of the first embodiment, except for the capacity of the non-volatile memory. FIG. 4 is a functional block diagram showing the structure of the semiconductor memory device according to the present embodiment.

In FIG. 4, the semiconductor memory device 2 includes, just as the semiconductor memory device 1, a selector 201, a control unit 202, a volatile memory 203, a non-volatile memory 204, and a power-supply unit 205. In particular, the non-volatile memory 204 consists of N memory areas, from memory area #1 to memory area #N. The memory areas each have the same capacity as that of the volatile memory 203.

Besides inputting and outputting the same kind of signals as the control unit 102, the control unit 202 receives an area-select signal from outside the semiconductor memory device 2. According to the received area-select signal, the control unit 202 selects a memory area from the memory areas #1–#N of the non-volatile memory so as to perform data copy between the selected memory area and the volatile memory 203.

That is, when the reference signal has changed from L to H, the control unit 202 inputs a select signal (L) to the selector 201, copies data from the non-volatile memory 204 corresponding to the received area-select signal to the volatile memory 203, and inputs a select signal (H) to the selector 201. Conversely, when the reference signal has changed from H to L, the control unit 202 inputs a select signal (L) to the selector 201, copies data from the volatile memory 203 to the non-volatile memory 204 corresponding to the received area-select signal, and inputs a select signal (H) to the selector 201.

In the first embodiment, in order to increase the capacity of the semiconductor memory device 1, the capacity of the volatile memory 103 should be increased, whereas the present embodiment is able to increase the capacity of the semiconductor memory device 2 as a non-volatile memory device, without increasing the capacity of the volatile memory 203. Therefore, the second embodiment has advantages of reducing cost for producing a semiconductor memory device, and reducing the device-size.

The Third Embodiment

Figure 5:
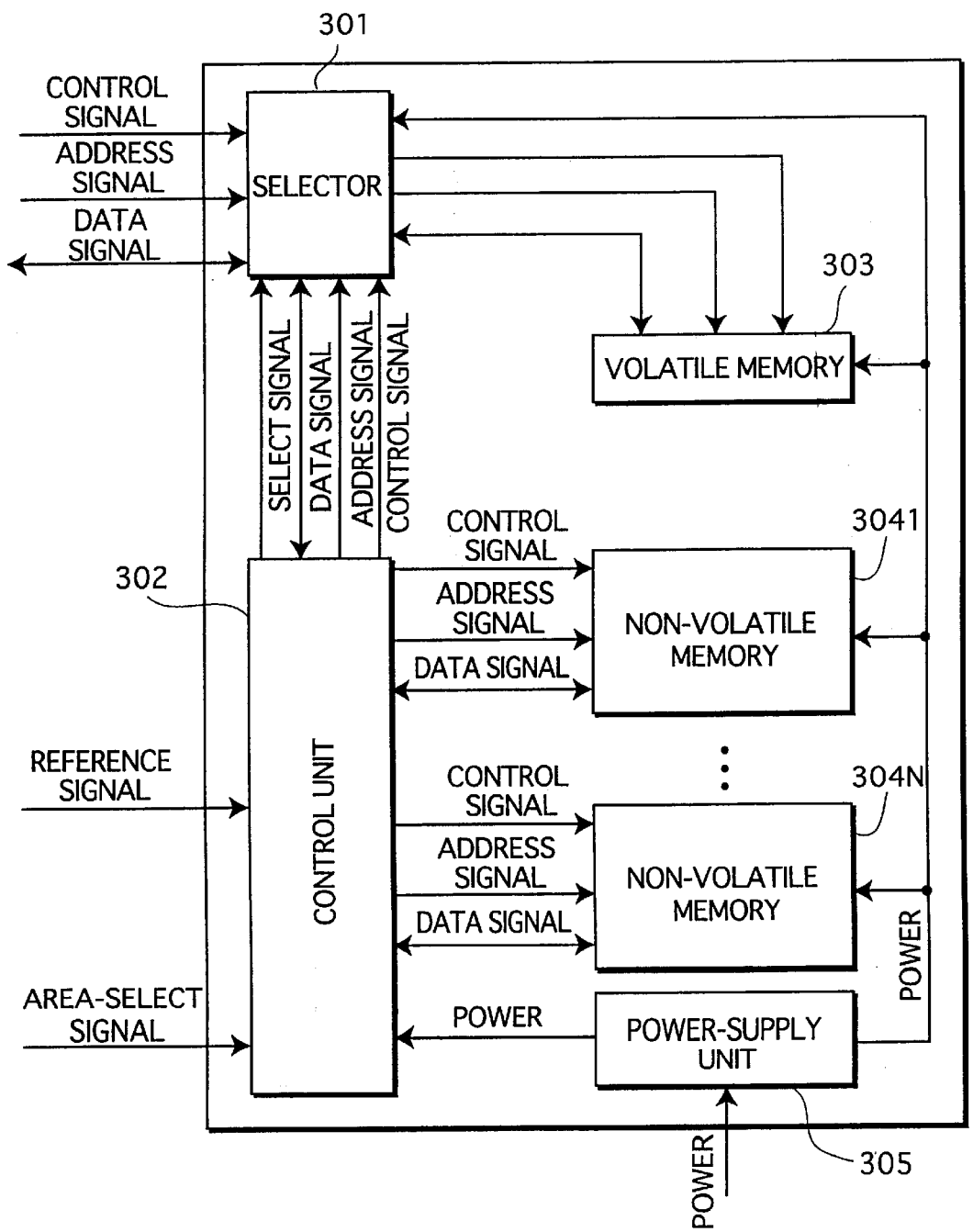
FIG. 5 is a functional block diagram showing the structure of the semiconductor memory device according to the third embodiment.

Next, a semiconductor memory device according to the third embodiment is described as follows. The structure of the semiconductor memory device according to the present embodiment is almost the same as that of the second embodiment, except that the non-volatile memory is increased in number, instead of in capacity. FIG. 5 is a functional block diagram showing the structure of the semiconductor memory device according to the present embodiment.

As shown in FIG. 5, the semiconductor memory device 3 includes a selector 301, a control unit 302, a volatile memory 303, non-volatile memories 3041–304N, and a power-supply unit 305. The non-volatile memories 3041–304N each have the same capacity as that of the volatile memory 303, and receive power from the power-supply unit 305.

In addition to having the same structure as the control unit 202 in the second embodiment, the control unit 302 has N interfaces used for accessing each of the non-volatile memories 3041–304N. The control unit 302 selects one of the non-volatile memories 3041–304N according to the area-select signal received from outside the semiconductor memory device 3, and performs data copy between the selected non-volatile memory and the volatile memory 303.

According to the above construction, unlike the semiconductor memory device 2 in the second embodiment, the number of erase/write cycles is counted for each non-volatile memory independently. Therefore, the life of the overall semiconductor memory device 3 will be further prolonged.

Note here that users may also use the semiconductor memory device 3 as an extremely long-life non-volatile memory having the same capacity as the volatile memory 303. Use of the semiconductor memory device 3 in this way further increases the maximum possible number of erase/write cycles by N-times. It is also possible to manipulate a reference signal and an area-select signal whenever necessary, so as to have the semiconductor memory device 3 perform data copy between the non-volatile memory 304 and the volatile memory 303. This enables use of the semiconductor memory device 3 as a large-capacity non-volatile memory.

The Fourth Embodiment

Figure 6:
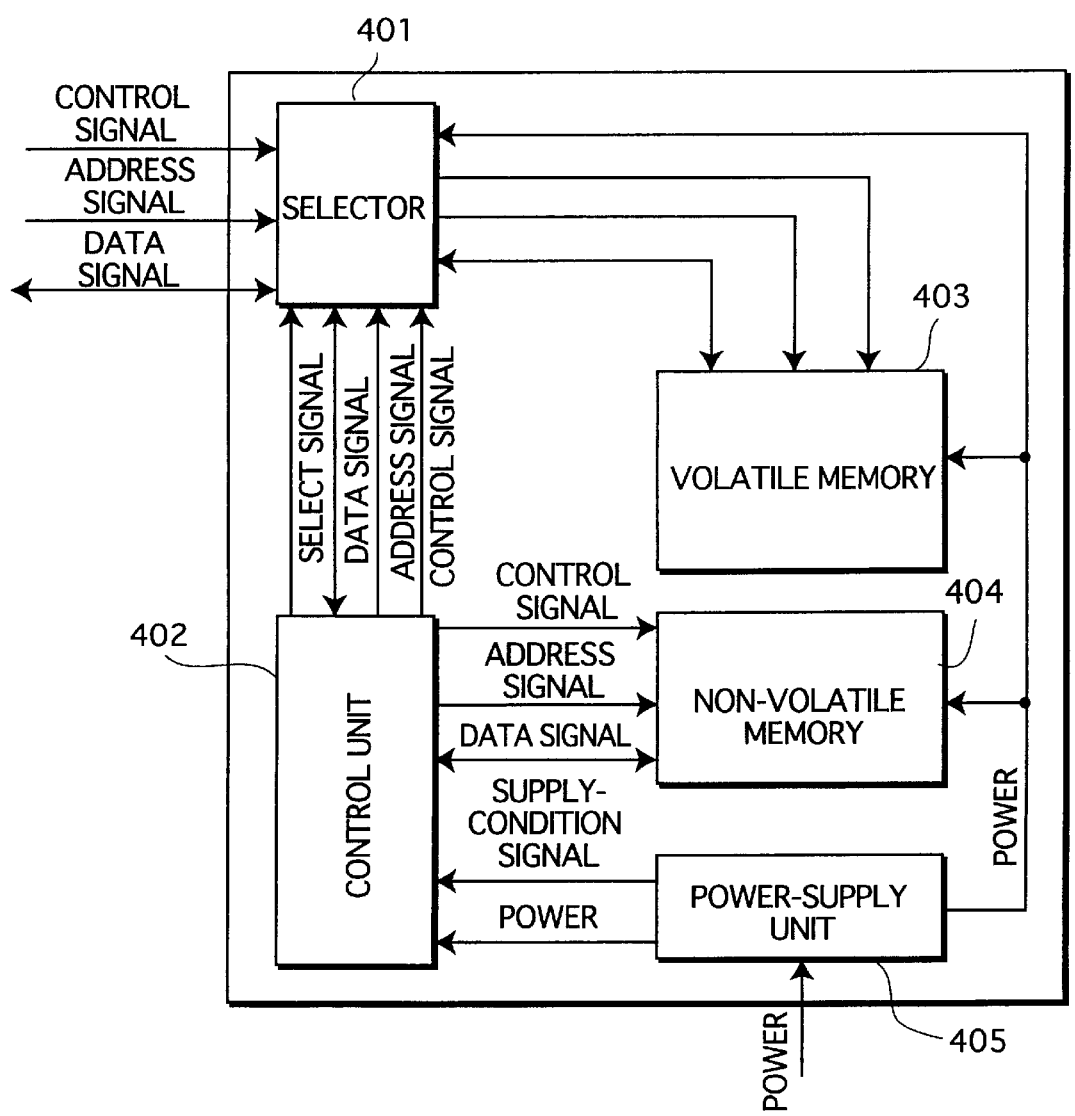
FIG. 6 is a functional block diagram showing the structure of the semiconductor memory device according to the fourth embodiment.

Next, a semiconductor memory device according to the fourth embodiment is described as follows. The structure of the semiconductor memory device according to the present embodiment is almost the same as that of the first embodiment, except for not requiring an input of a reference signal from outside. FIG. 6 is a functional block diagram showing the structure of the semiconductor memory device according to the present embodiment.

In FIG. 6, the semiconductor memory device 4 includes a selector 401, a control unit 402, a volatile memory 403, a non-volatile memory 404, and a power-supply unit 405. The power-supply unit 405 inputs a power-condition signal to the control unit 402. While receiving power from outside the semiconductor memory device 4 and supplying power to the control unit 402 and the like, the power-supply unit 405 outputs H as a supply-condition signal. Conversely, while supplying power using the power accumulated in itself, the power-supply unit 405 outputs L as a supply-condition signal.

When the control unit 405 detects that the supply-condition signal has changed from L to H, the control unit 402 inputs a select signal (L) to the selector 401, copies data from the non-volatile memory 404 to the volatile memory 403, and inputs a select signal (H) to the selector 401. On the other hand, when detecting that the supply-condition signal has changed from H to L, the control unit 402 inputs a select signal (L) to the selector 401, copies data from the volatile memory 403 to the non-volatile memory 404, then inputs a select signal (H) to the selector 401.

Note here that the selector 401, upon receiving an input of a select signal (L) from the control unit 402, permits the control unit 402 to access the volatile memory 403. In this way, the control unit 402 is allowed to perform data copy between the volatile memory 403 and the non-volatile memory 404. Conversely, when receiving a select signal (H), the selector 401 permits access from outside the semiconductor memory device 4 to the volatile memory 403.

The Fifth Embodiment

Next, a semiconductor memory device according to the fifth embodiment is described as follows. The semiconductor memory device according to the present embodiment is a combination of the structure of the semiconductor memory device of the second embodiment and that of the fourth embodiment, except for permitting an access from outside to the non-volatile memory as well.

Figure 7:
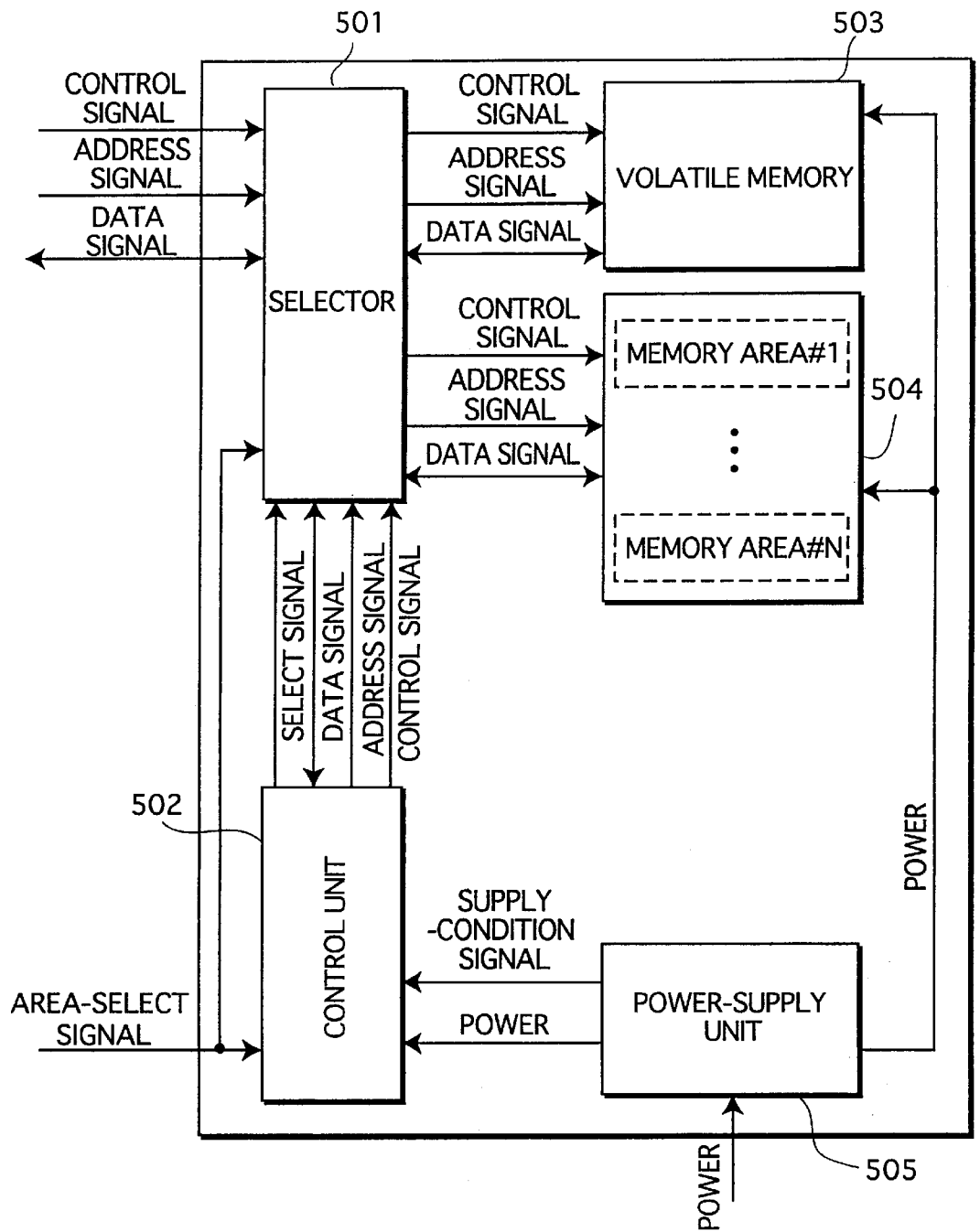
FIG. 7 is a functional block diagram showing the structure of the semiconductor memory device according to the fifth embodiment.

FIG. 7 is a functional block diagram showing the structure of the semiconductor memory device according to the present embodiment. In FIG. 7, the semiconductor memory device 5 includes a selector 501, a control unit 502, a volatile memory 503, a non-volatile memory 504, and a power-supply unit 505. Just as in the second embodiment, the non-volatile memory 504 is comprised of N memory areas, from memory area #1 to memory area #N, and the memory areas each have the same capacity as that of the volatile memory 503.

When the supply-condition signal has changed from L to H, the control unit 502 inputs a select signal (L) to the selector 501, copies data from the non-volatile memory 504 corresponding to the received area-select signal to the volatile memory 503, and inputs a select signal (H) to the selector 501, just as in the second embodiment. Conversely, when the supply-condition signal has changed from H to L, the control unit 502 inputs a select signal (L) to the selector 501, copies data from the volatile memory 503 to the non-volatile memory 504 corresponding to the received area-select signal, and inputs a select signal (H) to the selector 501.

An area-select signal is also inputted to the selector 501, as well as to the control unit 502. Upon receiving an access request from an external apparatus (e.g. CPU) outside the semiconductor memory device 5, the selector 501 refers to the inputted address signal. When the address contained in the address signal designates the memory area that is designated by the area-select signal, the selector 501 has the external apparatus access the volatile memory 503.

On the other hand, when the address signal inputted by the external apparatus (e.g. CPU) requesting access does not designate the memory area that is designated by the area-select signal, the selector 501 has the external apparatus access the non-volatile memory 504. Note that in this case, only a request for reading data from the non-volatile memory will be accepted, and not a request to write data to the non-volatile memory 504.

In the semiconductor memory device 5 described in the above, when it is necessary to write data, the data will be restored to the volatile memory 503, while when it is only required to read data, the data will be directly read from the non-volatile memory 504. Consequently, the semiconductor memory device 5 allows users to refer to a large amount of data, without requiring a large volatile memory in capacity. Furthermore, the semiconductor memory device 5 is capable of reading a large amount of data at high speeds, since the speed of reading data from the non-volatile memory is substantially the same as the speed of reading data from the volatile memory.

Modifications

This invention so far has been explained on the basis of the preferred embodiments; however, needless to say, the embodiments of this invention are not limited to the ones mentioned above. The following describes other possible modifications.

(1) The Amount of Power to be Accumulated in the Power-supply Unit

From the viewpoint of ensuring reliability in retaining stored data, the power to be accumulated such as in the power-supply unit 105 may be about 10 times as much as the amount actually required for copying between the volatile memory and the non-volatile memory.

As an example, the amount of power is calculated for a case where ferroelectric RAM is used as a non-volatile memory. Here, for writing data in a 1-bit cell in the ferroelectric RAM, the following are assumed: cell current of 1 $\mu A$, writing voltage of 5V, and writing time of 100 nsec. Then the energy required for writing data in the 1-bit cell is expressed as:

$$1\ \mu A \times 5V \times 100\ nsec = 0.5\ pJ$$

Suppose here that 1 Kb data is to be transferred from the volatile memory to the non-volatile memory. Then, the energy required to write all the data to the non-volatile memory is calculated as follows:

$$0.5\ pJ \times 1\ Kb = 0.5\ nJ \approx 0.14Wh$$

Even if the amount of power required for transferring data from the volatile memory to the non-volatile memory is added to the above-calculated value, the total amount of energy required for copying data from the volatile memory to the non-volatile memory will never exceed the value calculated by multiplying 0.14Wh by 10. This means that the amount of power required for copying data in the present invention is much less than the amount required by the conventional technology that entails operation of the whole circuit for data backup. As a consequence, reduction of cost in accumulating power will be realized by the present invention.

(2) Relation Between Capacity of Volatile Memory and Capacity of Non-volatile Memory In all the mentioned embodiments, the capacity of the non-volatile memory is made to be greater than that of the volatile memory. However, the capacity of the non-volatile memory may be smaller than that of the volatile memory. In such a case, arrangements may be made such as saving only a part of the memory area from the volatile memory, and accepting external designation of memory area to be saved.

Effects of the Present Invention

As described earlier, the present invention enables the power-supply unit in the semiconductor memory device to accumulate a required amount of power in itself, so as to use the accumulated power for the data copy performed between the volatile memory and the non-volatile memory. Therefore, when the external power supply to the semiconductor memory device stops, the data initially stored in the volatile memory will be saved to the non-volatile memory, without being lost.

For example, a so-called contact less integrated circuit card receives power through radio waves sent from outside. If the semiconductor memory device relating to the present invention is applied to such contact less integrated circuit cards, data stored at the semiconductor memory device will not be lost, even when there is an accidental power loss, such as when the card is placed out of reach of the radio waves.

Furthermore, the memory access from outside the semiconductor memory device will only be directed to the volatile memory portion. As a result, it will greatly reduce the erase/write cycles to be performed for the non-volatile memory portion, to practically remove the limitation on number of erase/write cycles. This will further speed up the memory access. Accordingly, for example, the present invention shortens time required for reading a large amount of data (e.g. file data) from the semiconductor memory device.

Still further, the amount of power that is required to be accumulated in the semiconductor memory device will be 10 times as much as the amount necessary for copying data from the volatile memory to the non-volatile memory, at the maximum, which is a great reduction in the amount of power to be accumulated, compared to the conventional technology. As a result, it becomes further possible to downscale the circuit including the semiconductor memory device.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor memory device being included in one chip, comprising:

a volatile memory;

a non-volatile memory;

a volatile memory access unit operable to allow a device external to the chip to access the volatile memory;

a data save unit operable to save data from the volatile memory to the non-volatile memory; and a power-supply unit operable to accumulate power therein, and supply the accumulated power to the data save unit for use in saving data, wherein the volatile memory, the non-volatile memory, the volatile memory access unit, the data save unit, and the power-supply unit are integrated into the chip.

2. The semiconductor memory device of claim 1 further comprising a condition-change detect unit operable to detect a change of a condition of a power supply to the chip from a source external to the chip, wherein the data save unit saves the data from the volatile memory to the non-volatile memory when the condition-change detect unit detects a change from power-on to power-off.

3. The semiconductor memory device of claim 2 further comprising a data restore unit operable to restore data having been stored in the non-volatile memory into the volatile memory when the condition-change detect unit detects a change from power-off to power-on.

4. The semiconductor memory device of claim 1 further comprising an area-designation receive unit operable to receive a designation of a memory area in the non-volatile memory, wherein the data save unit saves the data to the designated memory area.

5. The semiconductor memory device of claim 1 further comprising a non-volatile memory access unit operable to allow a device external to the chip to read data from the non-volatile memory.

6. The semiconductor memory device of claim 1, wherein the non-volatile memory is one of a flash memory and a ferroelectric RAM.

7. The semiconductor memory device of claim 1, wherein the power-supply unit is one of a chargeable secondary battery, a capacitor, and a reactance element, and accumulates power supplied to the chip from a source external to the chip.

* * * * *